(12) United States Patent
Kubota et al.

(10) Patent No.: US 10,064,296 B2
(45) Date of Patent: Aug. 28, 2018

(54) ELECTRIC CONNECTION BOX

(71) Applicant: Yazaki Corporation, Tokyo (JP)

(72) Inventors: Minoru Kubota, Shizuoka (JP); Hideaki Masui, Shizuoka (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 15/486,735

(22) Filed: Apr. 13, 2017

(65) Prior Publication Data

US 2017/0311457 A1 Oct. 26, 2017

(30) Foreign Application Priority Data

Apr. 20, 2016 (JP) ................................ 2016-084583

(51) Int. Cl.
| | |
|---|---|
| *H05K 5/00* | (2006.01) |
| *B60R 16/03* | (2006.01) |
| *G05F 5/00* | (2006.01) |

(52) U.S. Cl.
CPC ........... *H05K 5/0026* (2013.01); *B60R 16/03* (2013.01); *G05F 5/00* (2013.01)

(58) Field of Classification Search
CPC ...... G05F 5/00; H05K 5/0026; H05K 5/0247; B60R 16/0238; H01R 9/2491
See application file for complete search history.

(56) References Cited

U.S. PATENT DOCUMENTS 5,018,050 A * 5/1991 Maenishi ............. H05K 5/0247
335/202
5,023,752 A * 6/1991 Detter ................. B60R 16/0238
361/646

(Continued)

FOREIGN PATENT DOCUMENTS

| CN | 1741334 A | 3/2006 |
|---|---|---|
| JP | 2008054371 A | 3/2008 |

(Continued)

OTHER PUBLICATIONS

Communication dated May 15, 2018, from Japanese Patent Office in counterpart application No. 2016-084583.

(Continued)

*Primary Examiner* — Hoa C Nguyen
*Assistant Examiner* — Keith Depew
(74) *Attorney, Agent, or Firm* — Sughrue Mion, PLLC

(57) ABSTRACT

An electric connection box includes a housing in which a containing space is provided, and a first substrate unit and a second substrate unit which are contained in the containing space and output power input from a power source on the outside of the housing with respect to a load. The first substrate unit includes a first power source input terminal including a first terminal exposed portion, and the second substrate unit includes a second power source input terminal including a second terminal exposed portion. The first terminal exposed portion and the second terminal exposed portion are fastened by a fastening member and are electrically connected along with a power source connection terminal at least a part of which is exposed to the outside of the housing and which is connected to the power source, in a state where the first and second substrate units are contained in the housing.

9 Claims, 5 Drawing Sheets

(56) References Cited

U.S. PATENT DOCUMENTS

| | | | | |
|---|---|---|---|---|
| 5,795,193 | A * | 8/1998 | Yang | H01R 9/2458 439/620.27 |
| 6,077,102 | A * | 6/2000 | Borzi | H01R 9/2458 439/364 |
| 6,322,376 | B1 * | 11/2001 | Jetton | H01R 4/302 411/107 |
| 6,570,088 | B1 * | 5/2003 | Depp | B60R 16/0238 174/50 |
| 6,679,708 | B1 * | 1/2004 | Depp | H01R 9/2466 361/752 |
| 7,402,918 | B2 * | 7/2008 | Ikeda | H02G 3/088 307/9.1 |
| 8,393,934 | B2 | 2/2013 | Asao | |
| 2005/0111798 | A1 * | 5/2005 | Doiron | H05K 5/069 385/94 |
| 2006/0030176 | A1 | 2/2006 | Ikeda et al. | |
| 2011/0094794 | A1 * | 4/2011 | Asao | B60R 16/0238 174/549 |
| 2012/0010784 | A1 * | 1/2012 | Akiyama | B60R 16/03 701/45 |
| 2015/0201532 | A1 * | 7/2015 | Soyano | H05K 9/0037 361/752 |
| 2016/0344301 | A1 * | 11/2016 | Maruyama | H02M 7/48 |
| 2017/0105306 | A1 | 4/2017 | Takahashi et al. | |

FOREIGN PATENT DOCUMENTS

| | | |
|---|---|---|
| JP | 2013-123342 A | 6/2013 |
| JP | 2014-166088 A | 9/2014 |
| JP | 2014-166089 A | 9/2014 |
| JP | 2016010259 A | 1/2016 |
| WO | WO 2015199002 A1 * 12/2015 | ............... H05K 7/06 |

OTHER PUBLICATIONS

Communication dated Jun. 5, 2018 from the State Intellectual Property Office of the People's Republic of China in application No. 201710254268.1.

* cited by examiner

ELECTRIC CONNECTION BOX

CROSS-REFERENCE TO RELATED APPLICATION(S)

The present application claims priority to and incorporates by reference the entire contents of Japanese Patent Application No. 2016-084583 filed in Japan on Apr. 20, 2016.

BACKGROUND OF THE INVENTION

1. Field of the Invention

The present invention relates to an electric connection box.

2. Description of the Related Art

In the related art, a power distributor which distributes power supplied from a power source such as a battery to each load, a voltage converter which increases or decreases a voltage supplied from the power source and supplies the voltage to each load, and the like are mounted on a vehicle. The power distributor and the voltage converter, for example, are arranged in an engine room, are arranged in different positions according to the layout of vehicle constituents such as an engine which is mounted on the engine room, and are respectively connected to the power source through an electric wire for a power source.

On the other hand, recently, in order to respond to a demand for space saving of the power distributor and the voltage converter in the engine room, there is a case where the power distributor and the voltage converter are arranged in the engine room by being integrated. For example, in Japanese Patent Application Laid-open No. 2014-166088, Japanese Patent Application Laid-open No. 2014-166089, and Japanese Patent Application Laid-open No. 2013-123342, a technology is disclosed in which substrate having a function as the power converter (a DC/DC converter), and a substrate having a function as the power distributor are contained in a housing of one electric connection box which is disposed in the engine room.

In a case where the power distributor and the voltage converter are integrated, a plurality of power source connection terminals which are connected to the power source are formed in one electric connection box, and thus, in a case where the plurality of power source connection terminals are connected to each of the substrates described above in the housing, there is a concern that the temperature in the housing is increased by heat generated from the terminal when power is supplied to each of the substrates from the power source.

SUMMARY OF THE INVENTION

The present invention has been made in consideration of such circumstances described above, and an object of the present invention is to provide an electric connection box in which an increase in the temperature in a housing can be suppressed in a case where a plurality of substrate units which output power input from a power source on the outside of a housing with respect to a load are contained in an electric connection box.

In order to achieve the above mentioned object, an electric connection box according to one aspect of the present invention includes a housing that includes a containing space therein; a first substrate unit that is contained in the containing space, and outputs power input from a power source on the outside of the housing with respect to a load; and a second substrate unit that is contained in the containing space, outputs power input from a power source on the outside of the housing with respect to a load, and is different from the first substrate unit, wherein the first substrate unit includes a first power source input terminal that supplies power from the power source to the first substrate unit, the second substrate unit includes a second power source input terminal that supplies power from the power source to the second substrate unit, the first power source input terminal includes a first terminal exposed portion at least a part of which is exposed to the outside of the housing, the second power source input terminal includes a second terminal exposed portion at least a part of which is exposed to the outside of the housing, and the first terminal exposed portion, the second terminal exposed portion, and a power source connection terminal connected to the power source are fastened by a fastening member and are electrically connected to each other.

According to another aspect of the present invention, in the electric connection box, it is preferable to further include an inter-substrate power supply unit that supplies power output from the second substrate unit to the first substrate unit, wherein the inter-substrate power supply unit includes a first fitting portion that is electrically connected to the first substrate unit, and a second fitting portion that is electrically connected to the second substrate unit, and fits into the first fitting portion in a contained state in which the first substrate unit and the second substrate unit are contained in the housing.

According to still another aspect of the present invention, in the electric connection box, it is preferable that the first substrate unit includes a first substrate and a plurality of first electronic components, the second substrate unit includes a second substrate and a plurality of second electronic components, the first electronic component is mounted on the first substrate, the second electronic component is mounted on the second substrate, and in the containing space, the first electronic component faces the second electronic component between the first substrate and the second substrate.

According to still another aspect of the present invention, in the electric connection box, it is preferable that the first substrate unit is a power distributor that distributes and outputs power input from at least the power source, and the second substrate unit is a voltage converter that converts an input direct current voltage value into a different direct current voltage value.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, an embodiment of an electric connection box according to the present invention will be described in detail on the basis of the drawings. Furthermore, the present invention is not limited by the embodiment. In addition, the constituents of the embodiment described below include constituents which can be easily conceived by a person skilled in the art or constituents which are substantially identical to the constituents of the embodiment. In addition, the constituents of the embodiment described below can be subjected to various omissions, substitutions, and changes within a range not departing from the gist of the present invention.

Embodiment

Figure 1:
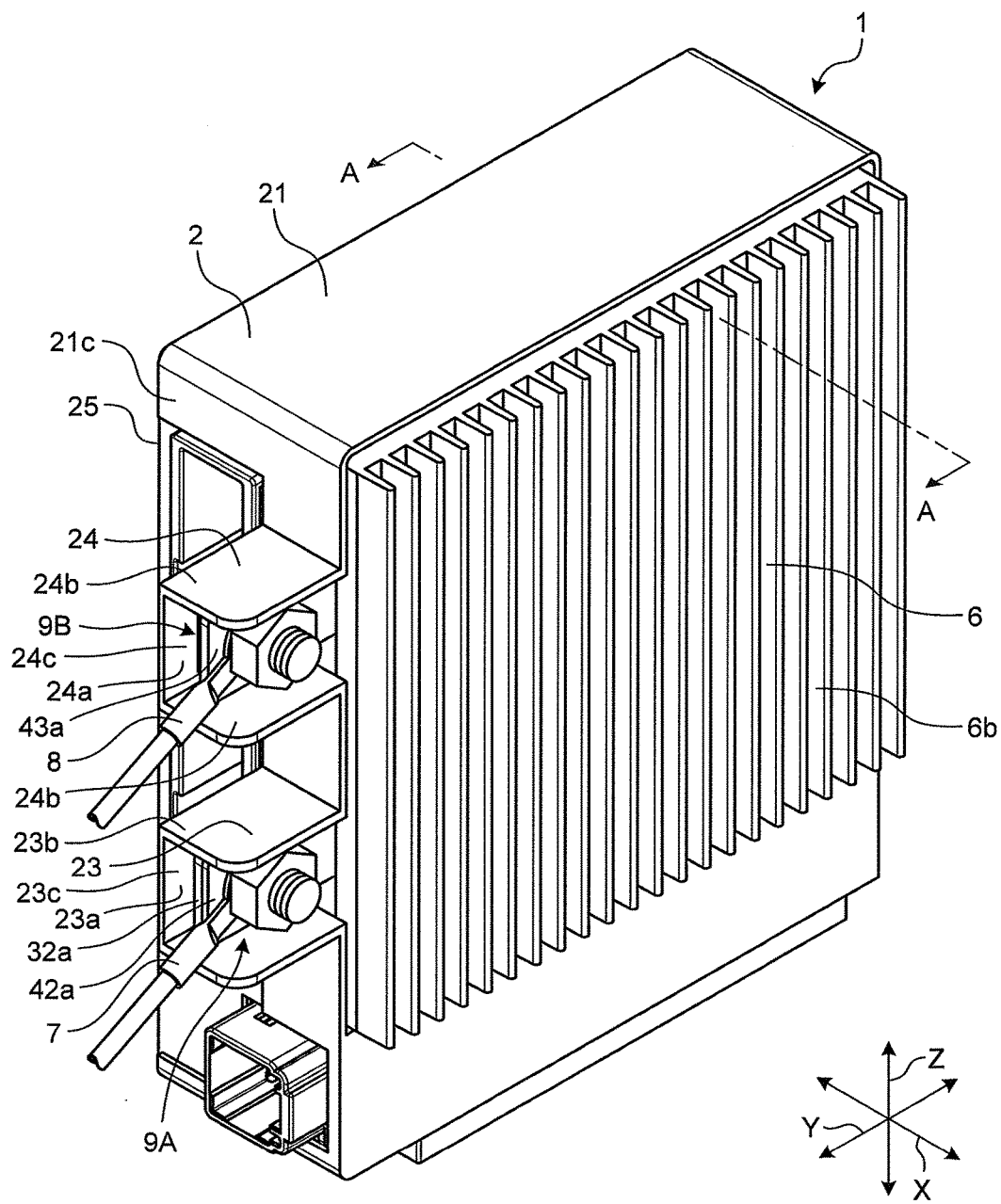
FIG. 1 is a perspective view illustrating an electric connection box according to an embodiment.
Figure 2:
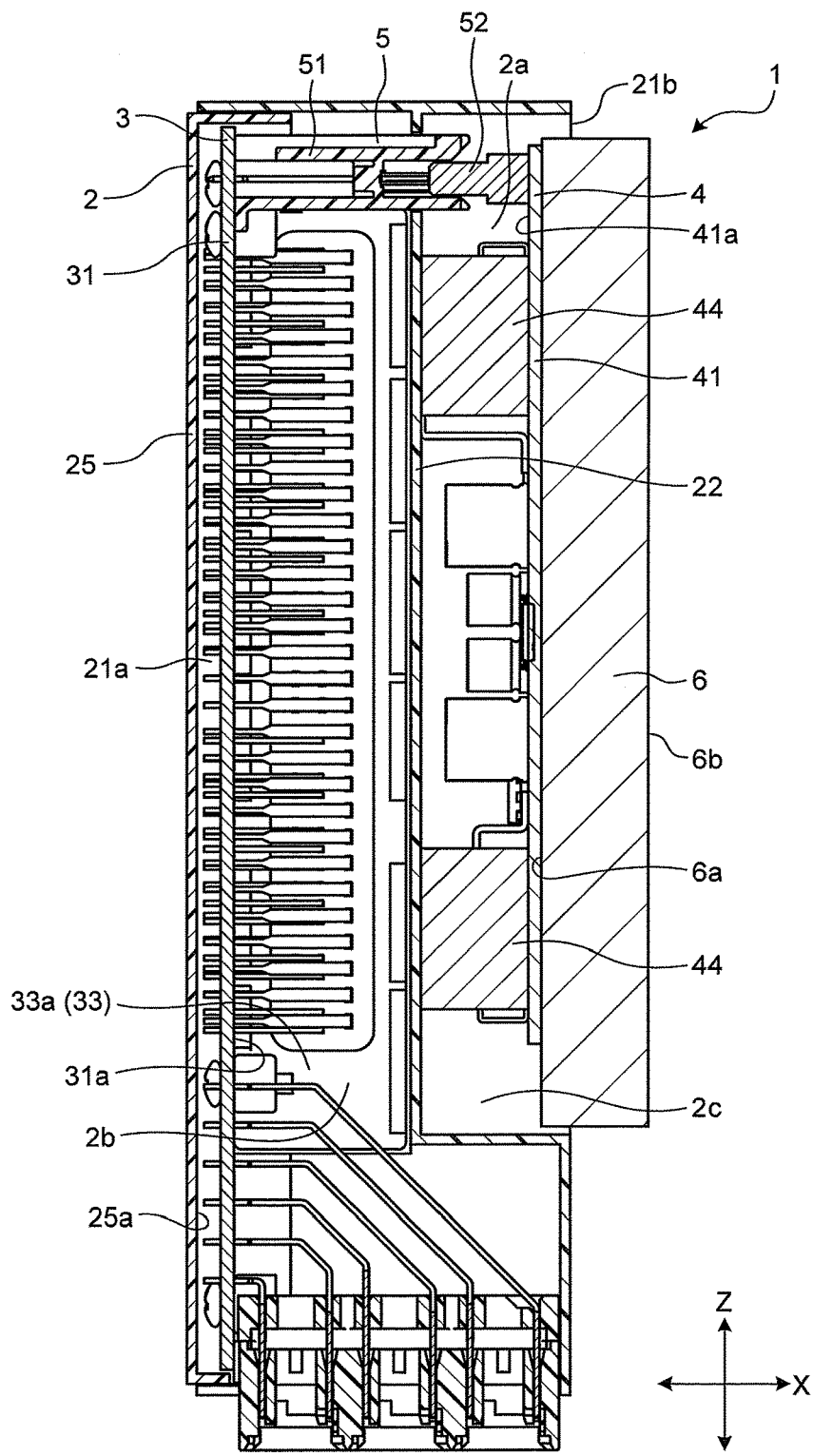
FIG. 2 is a sectional view of the electric connection box according to the embodiment.
Figure 3:
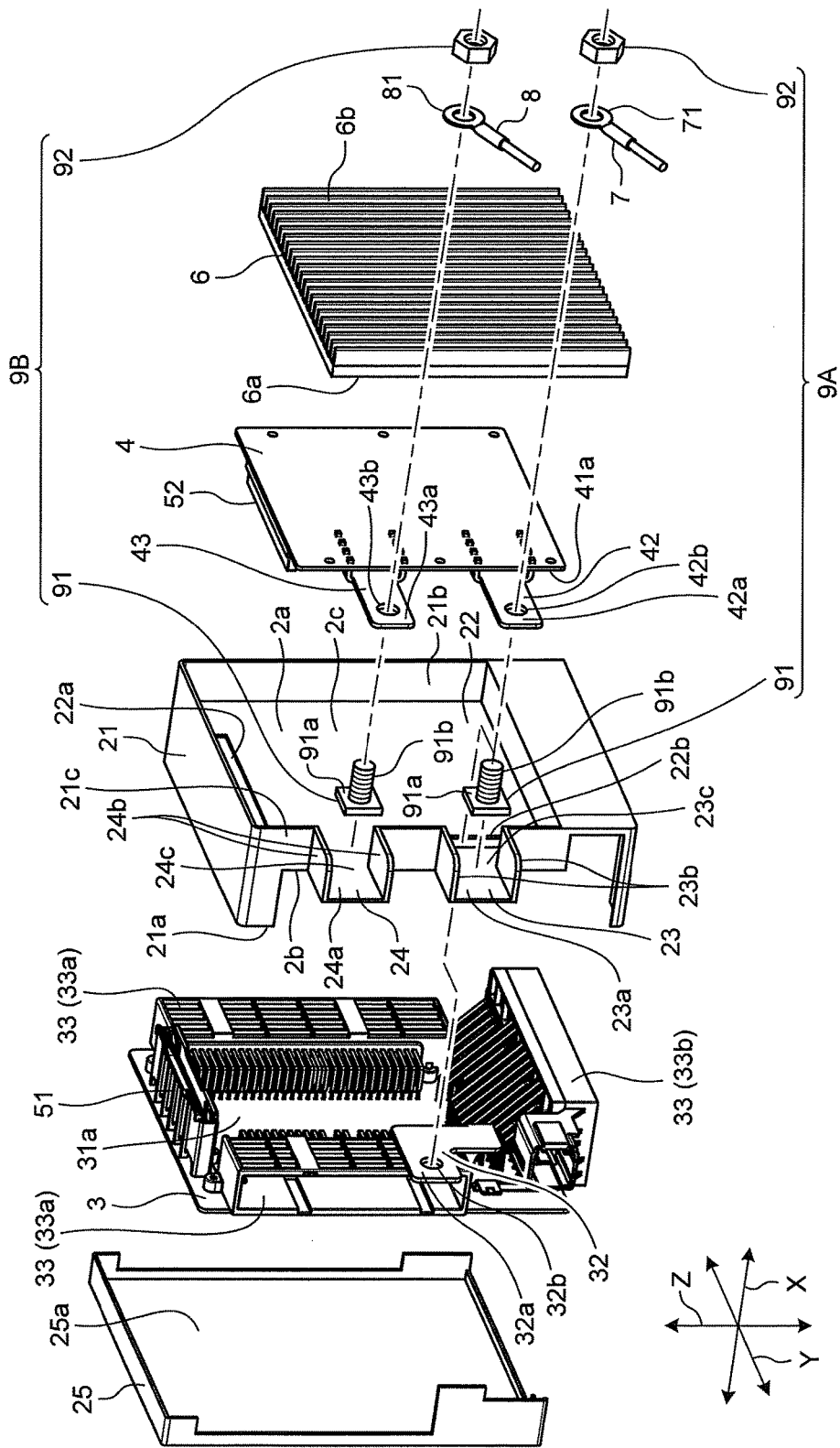
FIG. 3 is an exploded perspective view of the electric connection box according to the embodiment.
Figure 4:
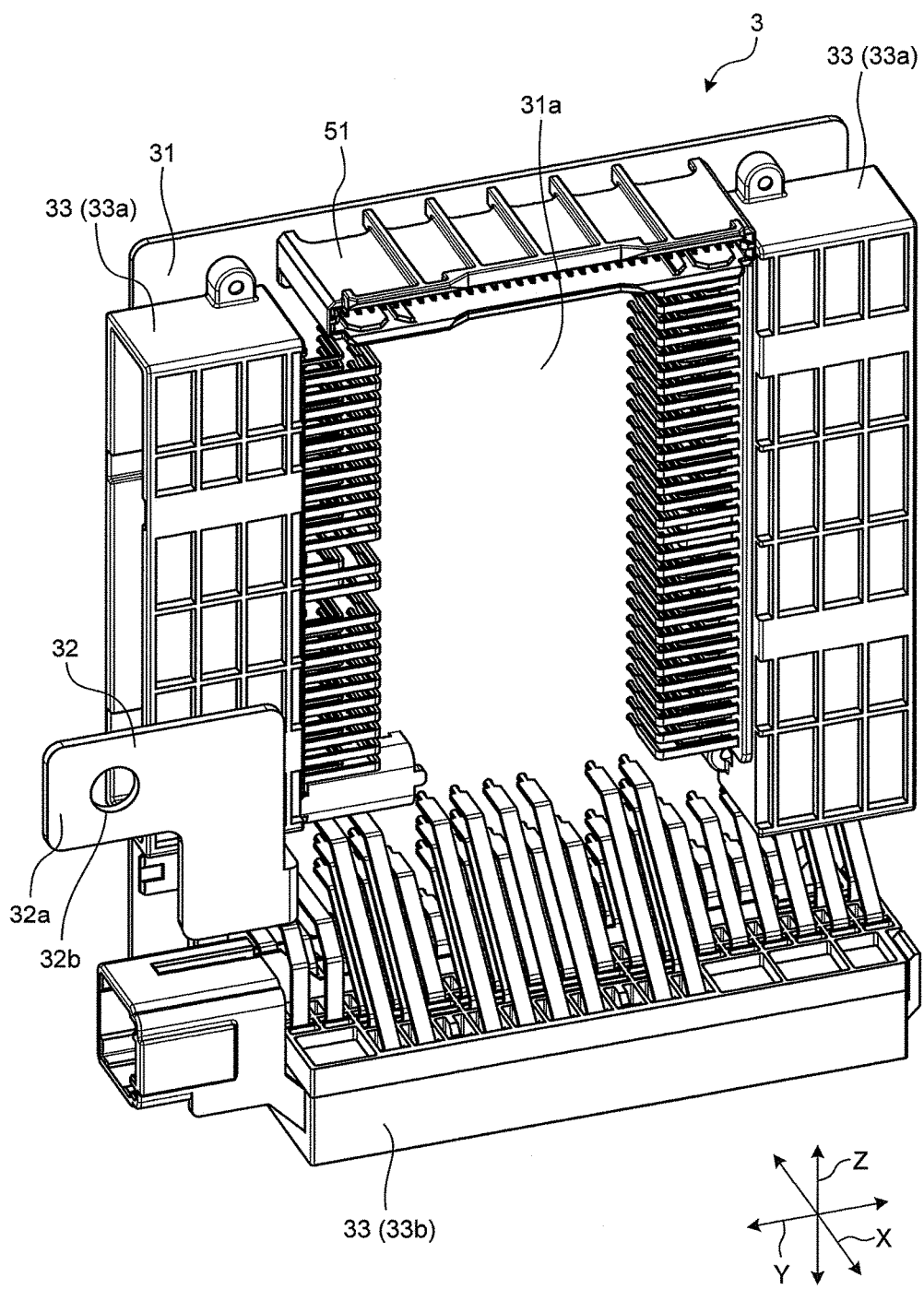
FIG. 4 is a perspective view of a power distribution unit.
Figure 5:
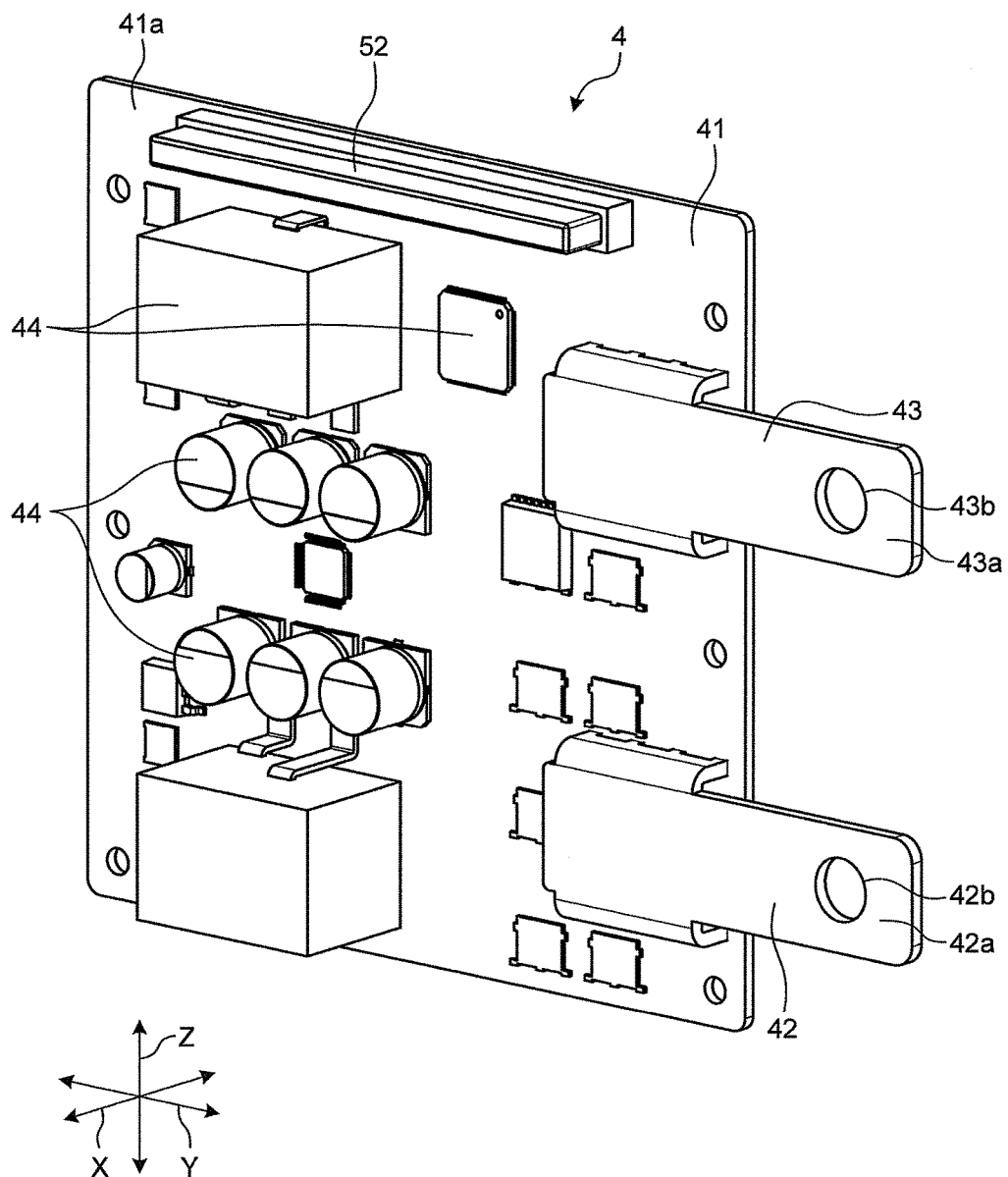
FIG. 5 is a perspective view of a voltage conversion unit.

First, an electric connection box according to an embodiment will be described. FIG. 1 is a perspective view illustrating the electric connection box according to the embodiment. FIG. 2 is a sectional view of the electric connection box according to the embodiment. FIG. 3 is an exploded perspective view of the electric connection box according to the embodiment. FIG. 4 is a perspective view of a power distribution unit. FIG. 5 is a perspective view of a voltage conversion unit. Here, FIG. 2 is a sectional view of A-A in FIG. 1. In addition, an X-direction in each of the drawings is a width direction of the electric connection box of this embodiment. A Y-direction is a depth direction of the electric connection box of this embodiment, and is a direction which is orthogonal to the width direction. A Z-direction is an up-and-down direction of the electric connection box of this embodiment, and is a direction which is orthogonal to the width direction and the depth direction.

An electric connection box 1 of this embodiment is disposed in an engine room or the like of a vehicle (not illustrated), and is connected between a power source such as a battery, and a load, that is, various electronic devices mounted in the vehicle. The electric connection box 1 increases and outputs a voltage input by the power source, and distributes power supplied from the power source to the various electronic devices mounted in the vehicle. As illustrated in FIG. 1 to FIG. 3, the electric connection box 1 includes a housing 2, a power distribution unit 3, a voltage conversion unit 4, and an inter-substrate power supply unit 5 that delivers power between the power distribution unit 3 and the voltage conversion unit 4.

As illustrated in FIG. 2 and FIG. 3, a containing space 2a is formed in the housing 2, the power distribution unit 3 and the voltage conversion unit 4 are contained in the containing space 2a. The housing 2 is formed of an insulating synthetic resin, and includes a main body portion 21, a partition wall 22, an input terminal container 23, an output terminal container 24, and a cover member 25.

The main body portion 21 is formed in the shape of a tube, includes the containing space 2a which is formed in the main body portion 21, and includes a first opening portion 21a and a second opening portion 21b which respectively communicate with the containing space 2a and face each other in the X-direction. The partition wall 22 is formed in the containing space 2a of the main body portion 21.

The partition wall 22 is formed to partition the containing space 2a in the X-direction. Accordingly, the partition wall 22 divides the containing space 2a into a first containing space 2b and a second containing space 2c in the X-direction. The first containing space 2b communicates with the first opening portion 21a, and the second containing space 2c communicates with the second opening portion 21b. The first containing space 2b contains the power distribution unit 3, and the second containing space 2c contains the voltage conversion unit 4. A through hole 22a and a through hole 22b which communicate with the first containing space 2b and the second containing space 2c, are formed in the partition wall 22. The inter-substrate power supply unit 5 is inserted to the through hole 22a, and thus, the inter-substrate power supply unit 5 is positioned in the first containing space 2b and the second containing space 2c. The through hole 22a is formed to have a size to which the inter-substrate power supply unit 5 can be inserted. A first power source input terminal 32 described below is inserted to the through hole 22b, and thus, a part of the first power source input terminal 32 positioned in the first containing space 2b is positioned in the second containing space 2c. The through hole 22b is formed to have a size to which the first power source input terminal 32 can be inserted.

The input terminal container 23 and the output terminal container 24 contain a part of the terminal, and are disposed on one target circumferential wall 21c of a circumferential wall of the main body portion 21. The input terminal container 23 contains a part of the first power source input terminal 32, a second power source input terminal 42, and a power source connection terminal 7. The input terminal container 23 includes a side plate 23a, a pair of facing plates 23b and 23b facing each other, and a terminal containing space 23c which is formed of the side plate 23a and the facing plates 23b and 23b and communicates with the outside of the housing 2. The output terminal container 24 contains a part of a load output terminal 43 described below. The output terminal container 24 includes a side plate 24a, a pair of facing plates 24b and 24b facing each other, and a terminal containing space 24c which is formed of the side plate 24a and the facing plates 24b and 24b and communicates with the outside of the housing 2. The side plate 23a and the side plate 24a are formed in the shape of a flat plate to protrude towards the outside of the housing 2 from the target circumferential wall 21c in the view from the X-direction. The facing plates 23b and the facing plates 24b are respectively formed on both end portions of the side plate 23a and the side plate 24a in the Z-direction to protrude towards a heatsink member 6 side described below in the Y-direction. Accordingly, the input terminal container 23 and the output terminal container 24 are formed in the shape of a quadrangle in which facing surfaces of the side plate 23a and the side plate 24a are opened in the view from the Y-direction. Both end surfaces of the input terminal container 23 and the output terminal container 24 are respectively opened in the Y-direction in the view from the X-direction. Accordingly, the terminal containing space 23c and the terminal containing space 24c communicate with the second containing space 2c, and communicate with the outside of the housing 2.

The cover member 25 blocks the first opening portion 21a, and blocks the first containing space 2b. The cover member 25 of this embodiment is formed in the shape of a tray (a dish) including one opening portion, and the power distribution unit 3 is attached to an inner wall surface 25a facing the opening portion, for example, by a fixing tool such as a screw.

The power distribution unit 3 is a first substrate unit which is contained in the first containing space 2b and outputs power input from the power source on the outside of the housing 2 with respect to a load, and is a power distributor which distributes and outputs power input from at least the power source. As illustrated in FIG. 4, the power distribution unit 3 includes a first substrate 31, the first power source input terminal 32, and a plurality of first electronic components 33. The first substrate 31, for example, is a hard substrate in the shape of a flat plate, such as a rigid substrate. The first substrate 31 includes a mounting surface 31a on which wiring (not illustrated) is printed, and the first power source input terminal 32, the plurality of first electronic components 33, and the like are mounted. The first substrate 31 is contained in the first containing space 2b such that the mounting surface 31a faces the partition wall 22.

The first power source input terminal 32 supplies power from the power source to the power distribution unit 3. One end portion of the first power source input terminal 32 is electrically connected to the first substrate 31, and the other end portion is fastened to the power source connection terminal 7, which is connected to the power source, by a fastening member 9A, and is electrically connected to the power source. The first power source input terminal 32 is formed of a conductive metal or the like in the shape of a flat plate along the Z-direction in the view from the Y-direction. A part of one end portion of the first power source input terminal 32 in the Y-direction is bent in the Z-direction, extends towards the first substrate 31, is electrically connected to the wiring of the first substrate 31, and is fixed to the first substrate 31. The other end portion of the first power source input terminal 32 in the Y-direction, that is, a tip portion is formed to protrude in the Y-direction from the first substrate 31 in the view from the X-direction. A part of the first power source input terminal 32 including the tip portion is contained in the terminal containing space 23c of the input terminal container 23 through the second containing space 2c, in a contained state where the power distribution unit 3 is contained in the first containing space 2b. Here, the terminal containing space 23c communicates with the outside of the housing 2, and thus, a portion of the first power source input terminal 32 which is contained in the terminal containing space 23c is exposed to the outside of the housing 2. A portion of the first power source input terminal 32 which is exposed to the outside of the housing 2 is a first terminal exposed portion 32a. In the terminal containing space 23c, the first terminal exposed portion 32a is fastened to a second terminal exposed portion 42a described below and the power source connection terminal 7 by the fastening member 9A, and is electrically connected to the second terminal exposed portion 42a and the power source connection terminal 7. A through hole 32b penetrating through the first power source input terminal 32 in the X-direction is formed in the first terminal exposed portion 32a of the first power source input terminal 32. A shaft 91b of a stud bolt 91 described below is inserted to the through hole 32b.

The plurality of first electronic components 33 are electronic components such as a plurality of female connectors 33a and a fuse mounting portion 33b. The female connector 33a allows a male connector connected to a load, that is, various electronic devices on the outside of the electric connection box 1 to be attachable and detachable. The female connector 33a is attached onto the mounting surface 31a, for example, by a fixing tool such as a screw such that an opening portion to which the male connector is inserted communicates with the outside of the housing 2. The female connector 33a includes a plurality of terminals formed of a conductive metal. In each of the terminals, one end portion is electrically connected to the wiring of the first substrate 31, and is formed to be bent in the shape of L. In each of the terminals, the other end portion is electrically connected to the male connector which is inserted from the opening portion of the female connector 33a. The male connector includes a plurality of terminals, and the terminals are respectively connected to various electronic devices through an electric wire. The male connector is inserted from the opening portion and fits into the female connector 33a, and thus, each terminal of the female connector 33a is electrically connected to each terminal of the male connector.

Accordingly, the power distribution unit 3 is capable of distributing and outputting power input into the first substrate 31 with respect to a load on the outside of the electric connection box 1. A plurality of fuses or fuse blocks can be mounted on the fuse mounting portion 33b. The fuse mounting portion 33b is disposed between the first power source input terminal 32 and the female connector 33a, and protects a circuit of the power distribution unit 3 and various electronic devices by the fuse mounted thereon. The fuse mounting portion 33b is attached onto the mounting surface 31a, for example, by a fixing tool such as a screw such that the opening portion to which the fuse is inserted communicates with the outside of the housing 2. The fuse mounting portion 33b includes a plurality of terminals formed of a conductive metal. In each of the terminals, one end portion is electrically connected to the wiring of the first substrate 31, and is formed to be bent in the shape of L. In each of the terminals, the other end portion is contained in a partition corresponding to each fuse mounted on the fuse mounting portion 33b one pair by one pair. In a case where the fuse is inserted to the partition of the fuse mounting portion 33b, a pair of terminals is electrically connected to the fuse, and power which is input into the first substrate 31 through the first power source input terminal 32 is transmitted to various electronic devices through the female connector 33a. Accordingly, in a case where an overcurrent flows between the power source and various electronic devices, the fuse blocks the circuit, and thus, the circuit of the power distribution unit 3 and various electronic devices can be protected.

The voltage conversion unit 4 is a second substrate unit which is contained in the second containing space 2c, and is different from the first substrate unit outputting power input from the power source on the outside of the housing 2 with respect to a load, and is a voltage boosting converter which converts an input direct current voltage value into a direct current voltage value higher than the input current value. As illustrated in FIG. 5, the voltage conversion unit 4 includes a second substrate 41, a second power source input terminal 42, a load output terminal 43, and a plurality of second electronic components 44. The second substrate 41, for example, is a hard substrate in the shape of a flat plate, such as a rigid substrate. The second substrate 41 includes a mounting surface 41a on which wiring (not illustrated) is printed, and the second power source input terminal 42, the load output terminal 43, the plurality of second electronic components 44, and the like are mounted. The second substrate 41 is contained in the second containing space 2c such that the mounting surface 41a faces the partition wall 22. Accordingly, the first electronic component 33 faces the second electronic component 44 between the first substrate 31 and the second substrate 41 in the containing space 2a by interposing the partition wall 22 therebetween.

The second power source input terminal 42 supplies power from the power source to the voltage conversion unit 4. One end portion of the second power source input terminal 42 is electrically connected to the second substrate 41, and the other end portion is fastened to the power source connection terminal 7, which is connected to the power source, by the fastening member 9A, and is electrically connected to the power source. The second power source input terminal 42 is formed of a conductive metal or the like in the shape of a flat plate along the Z-direction in the view from the Y-direction. A part of one end portion of the second power source input terminal 42 in the Y-direction is bent in the Z-direction, extends towards the second substrate 41, is electrically connected to the wiring of the second substrate 41, and is fixed to the second substrate 41. The other end portion of the second power source input terminal 42 in the Y-direction, that is, a tip portion is formed to protrude in the Y-direction from the second substrate 41 in the view from the X-direction. A part of the second power source input terminal 42 including the tip portion is contained in the terminal containing space 23c of the input terminal container 23 in a contained state where the voltage conversion unit 4 is contained in the second containing space 2c. Here, the terminal containing space 23c communicates with the outside of the housing 2, and thus, a portion of the second power source input terminal 42 which is contained in the terminal containing space 23c is exposed to the outside of the housing 2. A portion of the second power source input terminal 42 which is exposed to the outside of the housing 2 is a second terminal exposed portion 42a. In the terminal containing space 23c, the second terminal exposed portion 42a is fastened to the first terminal exposed portion 32a and the power source connection terminal 7 by the fastening member 9A, and is electrically connected to the first terminal exposed portion 32a and the power source connection terminal 7. A through hole 42b penetrating through the second power source input terminal 42 in the X-direction is formed in the second terminal exposed portion 42a of the second power source input terminal 42. The shaft 91b of the stud bolt 91 described below is inserted to the through hole 42b.

The load output terminal 43 outputs a voltage which is boosted by the voltage conversion unit 4 to a load having large power consumption with respect to a load to which power is supplied from the power distribution unit 3 such as a starter, in various electronic devices on the outside of the electric connection box 1. The load output terminal 43 is formed of a conductive metal or the like in the shape of a flat plate along the Z-direction in the view from the Y-direction. A part of one end portion of the load output terminal 43 in the Y-direction is bent in the Z-direction, extends towards the second substrate 41, is electrically connected to the wiring of the second substrate 41, and is fixed to the second substrate 41. The other end portion of the load output terminal 43 in the Y-direction, that is, a tip portion is formed to protrude in the Y-direction from the second substrate 41 in the view from the X-direction. A part of the load output terminal 43 including the tip portion is contained in the terminal containing space 24c of the output terminal container 24 in a contained state. Here, the terminal containing space 24c communicates with the outside of the housing 2, and thus, a portion of the load output terminal 43 which is contained in the terminal containing space 24c is exposed to the outside of the housing 2. A portion of the load output terminal 43 which is exposed to the outside of the housing 2 is a load terminal exposed portion 43a. In the terminal containing space 24c, the load terminal exposed portion 43a is fastened to a load connection terminal 8 by a fastening member 9B, and is electrically connected to the load connection terminal 8. A through hole 43b penetrating through the load output terminal 43 in the X-direction is formed in the load terminal exposed portion 43a of the load output terminal 43. The shaft 91b of the stud bolt 91 described below is inserted to the through hole 43b.

The plurality of second electronic components 44 are an electronic components for increasing and outputting a voltage input by the power source, such as a switching element or a coil. The plurality of second electronic components 44 are electrically connected and fixed to the wiring of the mounting surface 41a of the second substrate 41 by means such as soldering.

The inter-substrate power supply unit 5 supplies power output from the voltage conversion unit 4 to the power distribution unit 3. As illustrated in FIG. 2 and FIG. 3, the inter-substrate power supply unit 5 includes a first fitting portion 51 and a second fitting portion 52.

The first fitting portion 51 is attached to the mounting surface 31a, for example, by a fixing tool such as a screw, and is electrically connected to the power distribution unit 3. The first fitting portion 51 is a so-called female type connector fitting into the second fitting portion 52. The first fitting portion 51 is formed of an insulating synthetic resin or the like in the shape of a tube to protrude in the X-direction from the mounting surface 31a, includes an opening portion which communicates with an internal space, in a tip portion, and includes a plurality of terminals which are electrically connected to the wiring of the first substrate 31 exposed to the internal space.

The second fitting portion 52 is attached to the mounting surface 41a, for example, by a fixing tool such as a screw, and is electrically connected to the voltage conversion unit 4. The second fitting portion 52 is a so-called male type connector fitting into the first fitting portion 51. The second fitting portion 52 is formed of an insulating synthetic resin or the like in the shape of a rectangle to protrude in the X-direction from the mounting surface 41a, and is formed to have a shape in which a tip portion can be inserted to the internal space from the opening portion of the first fitting portion 51. A plurality of terminals which are electrically connected to the wiring of the second substrate 41 exposed to the outside, are disposed in the tip portion of the second fitting portion 52. Here, the first fitting portion 51 and the second fitting portion 52 fit into each other in a contained state where the power distribution unit 3 and the voltage conversion unit 4 are contained in the housing 2, and the respective terminals are electrically connected to the power distribution unit 3 and the voltage conversion unit 4, and thus, a shape is set such that the power distribution unit 3 is electrically connected to the voltage conversion unit 4.

As illustrated in FIG. 1 to FIG. 3, the heatsink member 6 mainly releases heat which is generated by the voltage conversion unit 4 to the outside of the housing 2. The heatsink member 6 is attached to the voltage conversion unit 4, and in the contained state of the voltage conversion unit 4, the heatsink member 6 blocks the second opening portion 21b, and blocks the second containing space 2c. The heatsink member 6 is formed of a metal having excellent thermal conductivity, or the like in the shape of a flat plate, and the second substrate 41 is fixed to an inner wall surface 6a, which is one surface in the X-direction, for example, by a fixing tool such as a screw, in a state where the inner wall surface 6a is in contact with a surface of the second substrate 41 on a side opposite to the mounting surface 41a. In addition, in order to efficiently release heat, an outer wall surface 6b of the heatsink member 6, which is a surface on a side opposite to the inner wall surface 6a, has an concavo-convex shape along the Y-direction.

The power source connection terminal 7 is connected to the power source such as a battery, and supplies power to the power distribution unit 3 and the voltage conversion unit 4. The power source connection terminal 7 is formed of a conductive metal or the like, one end portion of the power source connection terminal 7 is connected to the power source through an electric wire, and a ring portion 71 is formed in the other end portion. The shaft 91b of the stud bolt 91 is inserted to the ring portion 71. As illustrated in FIG. 1, in the terminal containing space 23c, the power source connection terminal 7 is fastened by the fastening member 9A, along with the first power source input terminal 32 and the second power source input terminal 42.

The load connection terminal 8 is connected to loads, which are various electronic devices on the outside of the electric connection box 1, and supplies power which is boosted by the voltage conversion unit 4 to the load. The load connection terminal 8 is formed of a conductive metal or the like and has the same shape as that of the power source connection terminal 7, one end portion of the load connection terminal 8 is connected to the load through an electric wire, and a ring portion 81 is formed in the other end portion. The shaft 91b of the stud bolt 91 is inserted to the ring portion 81. As illustrated in FIG. 1, in the terminal containing space 24c, the load connection terminal 8 is fastened by the fastening member 9B, along with the load output terminal 43.

As illustrated in FIG. 1 and FIG. 3, the fastening members 9A and 9B respectively fasten each of the input terminal and the output terminal which are exposed to the outside of the housing 2, and each of the connection terminals. The fastening member 9A is contained in the terminal containing space 23c, fastens the first power source input terminal 32, the second power source input terminal 42, and the power source connection terminal 7, and electrically connects the terminals to each other. The fastening member 9B is contained in the terminal containing space 24c, fastens the load output terminal 43 and the load connection terminal 8, and electrically connects the terminals to each other. The fastening members 9A and 9B are formed of a conductive metal or the like, and for example, includes the stud bolt 91 and a nut 92. The stud bolt 91 includes a bottom portion 91a in the shape of a flat plate, and the shaft 91b formed to protrude in the X-direction from the bottom portion 91a. Here, the bottom portion 91a can be contained in the terminal containing space 23c or the terminal containing space 24c, and is formed to have a shape in which the rotation around the shaft 91b is regulated by the input terminal container 23 or the output terminal container 24. A male screw is formed on an outer circumferential surface of the shaft 91b, and thus, the shaft 91b is screwed to the nut 92. Here, the shaft 91b of the fastening member 9A is inserted to the through hole 32b, the through hole 42b, and the ring portion 71. The shaft 91b of the fastening member 9B is inserted to the through hole 43b and the ring portion 81. Each of the terminals, which are fastening targets, is interposed between the nut 92 and the bottom portion 91a, and a female screw is formed on an inner circumferential surface. That is, when the nut 92 is screwed to the stud bolt 91, the rotation of the bottom portion 91a around the shaft 91b along with the nut 92 is regulated, and thus, in order to regulate the rotation of the stud bolt 91, the stud bolt 91 is not retained by a tool. Therefore, it is possible to easily fasten the fastening members 9A and 9B.

Next, an example of the assembly of the electric connection box 1 of this embodiment will be described. First, an operator allows the power distribution unit 3 fixed to the cover member 25 to face the first containing space 2b such that the first electronic component 33 faces the partition wall 22, and inserts the power distribution unit 3 to the first containing space 2b from the first opening portion 21a in the X-direction. Here, when the operator inserts the power distribution unit 3 to the first containing space 2b, the operator inserts the tip portion of the first power source input terminal 32 positioned in the first containing space 2b to the through hole 22b, and positions the tip portion in the second containing space 2c. Next, the operator inserts the shaft 91b to the through hole 32b of the first power source input terminal 32 positioned in the second containing space 2c such that the bottom portion 91a of the stud bolt 91 is on the first substrate 31 side. In addition, when the operator inserts the power distribution unit 3 to the first containing space 2b, the operator inserts the first fitting portion 51 to the through hole 22a, and positions a part of the first fitting portion 51 in the second containing space 2c. Next, in a case where the operator further inserts the power distribution unit 3 to the first containing space 2b in the X-direction, the first containing space 2b is blocked by the cover member 25, and the power distribution unit 3 is contained in the containing space 2a. At this time, in the first power source input terminal 32, the first terminal exposed portion 32a is contained in the terminal containing space 23c formed on the outside of the main body portion 21, along with the stud bolt 91 in a state where the shaft 91b is inserted to the through hole 32b. Here, the cover member 25 engages with the main body portion 21 by an engaging mechanism (not illustrated), or the like.

Next, the operator allows the voltage conversion unit 4 fixed to the heatsink member 6 to face the second containing space 2c such that the second electronic component 44 faces the partition wall 22, and inserts the power convert unit 4 to the second containing space 2c from the second opening portion 21b in the X-direction. Next, the operator inserts the shaft 91b to the through hole 42b of the second power source input terminal 42 such that the bottom portion 91a of the stud bolt 91 is on the second substrate 41 side. Next, in a case where the operator further inserts the power convert unit 4 to the second containing space 2c in the X-direction, the second containing space 2c is blocked by the heatsink member 6, and the voltage conversion unit 4 is contained in the containing space 2a. At this time, in the second power source input terminal 42, the through hole 42b is inserted to the shaft 91b to which the through hole 32b is inserted, and the second terminal exposed portion 42a is contained in the terminal containing space 23c formed on the outside of the main body portion 21. In addition, in the load output terminal 43, the load terminal exposed portion 43a is contained in the terminal containing space 24c formed on the outside of the main body portion 21, along with the stud bolt 91 in a state where the shaft 91b is inserted to the through hole 43b. In addition, the second fitting portion 52 is inserted to the opening portion of the first fitting portion 51, which is positioned in the second containing space 2c, and the second fitting portion 52 fits into the first fitting portion 51. Here, the heatsink member 6 engages with the main body portion 21 by an engaging mechanism (not illustrated) or the like.

Next, the operator inserts the ring portion 71 of the power source connection terminal 7 to the shaft 91b of the stud bolt 91 contained in the terminal containing space 23c, and inserts the ring portion 81 of the load connection terminal 8 to the shaft 91b of the stud bolt 91 contained in the terminal containing space 24c. Next, the operator screws each of the nuts 92 to each of the shafts 91b. Accordingly, in the contained state where the power distribution unit 3 and the voltage conversion unit 4 are contained in the housing 2, the first terminal exposed portion 32a and the second terminal exposed portion 42a which are exposed to the outside of the housing 2, and the power source connection terminal 7 are fastened by the fastening member 9A, and the load terminal exposed portion 43a which is exposed to the outside of the housing 2, and the load connection terminal 8 are fastened by the fastening member 9B.

As described above, in the electric connection box 1 of this embodiment, the power distribution unit 3 and the voltage conversion unit 4 are contained in the containing space 2a of the housing 2. In the contained state where the power distribution unit 3 and the voltage conversion unit 4 are contained in the housing 2, the first terminal exposed portion 32a and the second terminal exposed portion 42a, which are parts of the first power source input terminal 32 and the second power source input terminal 42, are exposed to the outside of the housing 2, and are fastened to the power source connection terminal 7 connected to the power source by the fastening member 9A, and thus, power is supplied from the power source. Therefore, even in a case where each of the terminals 32, 42, and 7 produces heat, it is possible to release heat to the outside of the housing 2 through the first terminal exposed portion 32a and the second terminal exposed portion 42a. Accordingly, it is possible to suppress an increase in the temperature in the housing 2, compared to a case where each of the terminals 32, 42, and 7 is fastened in the housing 2.

In addition, the first power source input terminal 32 and the second power source input terminal 42 are electrically directly connected to one power source connection terminal 7. Accordingly, the power distribution unit 3 is disposed to be separated from the voltage conversion unit 4, and thus, it is possible to reduce the number of electric wires connected to the power source connection terminal 7 and the power source to be one, compared to a case where each of the first power source input terminal 32 and the second power source input terminal 42 is connected to the power source. Accordingly, it is possible to reduce the weight of a wire harness (W/H) including the electric connection box 1 or to simplify a routing operation thereof. In addition, the first power source input terminal 32 and the second power source input terminal 42 are directly connected to the power source connection terminal 7 by the fastening member 9A, and thus, an electric wire which is routed between the first power source input terminal 32 and the second power source input terminal 42 is not required. Accordingly, it is possible to suppress a power loss due to the resistance of the electric wire itself, and to improve the performance of the electric connection box 1.

In addition, the load output terminal 43 is exposed to the outside of the housing 2, and is fastened to the load connection terminal 8 connected to the power source by the fastening member 9B, and thus, even in a case where each of the terminals 43 and 8 produces heat due to power supplied from the power source, it is possible to release heat to the outside of the housing 2 through the load terminal exposed portion 43a. Accordingly, it is possible to suppress an increase in the temperature in the housing 2, compared to a case where each of the terminals 43 and 8 is fastened in the housing 2.

In addition, the first terminal exposed portion 32a, the second terminal exposed portion 42a, and the load terminal exposed portion 43a are exposed to the outside of the housing 2, and thus, it is possible for the operator to easily perform the maintenance of the electric connection box 1, such as attachment or detachment, and to improve a working efficiency with respect to the electric connection box 1.

In addition, in the electric connection box 1 of this embodiment, the inter-substrate power supply unit 5 is configured by allowing the first fitting portion 51 to fit into the second fitting portion 52, in the contained state where the power distribution unit 3 and the voltage conversion unit 4 are contained in the containing space 2a. That is, the inter-substrate power supply unit 5 is configured by only allowing the first fitting portion 51 to fit into the second fitting portion 52 at the same time that the power distribution unit 3 and the voltage conversion unit 4 are contained in the containing space 2a, and thus, it is possible to simplify the assembly of the electric connection box 1, compared to a case where the power distribution unit 3 is electrically connected to the voltage conversion unit 4 by soldering or the like through a bus bar or the like. Therefore, it is possible to improve the productivity or the maintainability of the electric connection box 1.

In addition, the electric connection box 1 of this embodiment contains the power distribution unit 3 and the voltage conversion unit 4 in the first containing space 2b and the second containing space 2c, respectively, and thus, it is possible to contain a plurality of types of voltage conversion units 4 different from one type of power distribution unit 3 in one containing space 2a, and to contain a plurality of types of power distribution units 3 different from one type of voltage conversion unit 4 in one containing space 2a.

In addition, in the electric connection box 1 of this embodiment, the first electronic component 33 faces the second electronic component 44 in the X-direction, in the contained state of the power distribution unit 3 and the voltage conversion unit 4. Accordingly, the first electronic component 33 and the second electronic component 44 are arranged on an air layer between the first substrate 31 and the second substrate 41. The thermal conductivity of the air is lower than the thermal conductivity of a solid such as a resin or a metal configuring the power distribution unit 3 and the voltage conversion unit 4, and thus, it is possible to suppress the heat interference between the power distribution unit 3 and the voltage conversion unit 4 in a case where the power distribution unit 3 and the voltage conversion unit 4 produce heat.

In addition, in the main body portion 21 of this embodiment, the partition wall 22 is formed in the containing space 2a, but the configuration is not limited thereto, and the partition wall 22 may not be disposed. In this case, the first electronic component 33 faces the second electronic component 44 in the X-direction, and thus, it is possible to dispose the second electronic component 44 in a space where the first electronic component 33 is not mounted. Therefore, it is possible to shorten the length of the electric connection box 1 in the X-direction.

The first substrate unit 3 and the second substrate unit 4 of this embodiment are the power distribution unit 3 and the voltage conversion unit 4, but the configuration is not limited thereto, and the first substrate unit 3 and the second substrate unit 4 may be a fuse box, an AC/DC converter, an AC/AC converter, an ECU box, and the like insofar as power input from the power source on the outside of the housing is output with respect to a load.

The first electronic component 33 and the second electronic component 44 of this embodiment may be mounted on only one of the mounting surface 31a and the mounting surface 41a of the first substrate 31 and the second substrate 41, but the configuration is not limited thereto, and the first electronic component 33 and the second electronic component 44 may be mounted on both of the mounting surface 31a and the mounting surface 41a.

One first power source input terminal 32 and one second power source input terminal 42 of this embodiment are disposed on each of the substrates, and are respectively connected to one power source, but the configuration is not limited thereto. For example, in a vehicle on which a plurality of power sources are mounted, the other power source becomes a load with respect to one power source. That is, in a case where power is supplied to the voltage converter from one power source through the power source input terminal, the voltage conversion unit 4 outputs power to a plurality of loads including the other power source. A plurality of power source input terminals or a plurality of load output terminals are respectively disposed in such an electric connection box 1, and a part of each of the terminals is exposed to the outside of the housing 2, and is connected to each connection wire or the like.

The fastening members 9A and 9B of this embodiment are configured of the stud bolt 91 and the nut 92, but the configuration is not limited thereto, and for example, the fastening members 9A and 9B may be fastening members fastening the respective terminals, such as solder.

The voltage conversion unit 4 of this embodiment is a voltage boosting converter, and may be a step-down voltage converter in a case where the power generation of an alternator is a comparatively large voltage, and a battery is efficiently charged, such as a regenerative braking system.

The electric connection box according to the present embodiment has an effect in which the first substrate unit and the second substrate unit are contained in the containing space in the housing, but at least a part of each of the first power source input terminal and the second power source input terminal is exposed to the outside of the housing and is fastened to the power source connection terminal connected to the power source by the fastening member in the first terminal exposed portion and the second terminal exposed portion which are exposed to the outside of the housing, in each of the terminals, and thus, even in a case where each of the terminals produces heat by power supplied from the power source, it is possible to release heat to the outside of the housing through the first terminal exposed portion and the second terminal exposed portion and to suppress an increase in the temperature in the housing.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electric connection box comprising:
a housing that includes a containing space therein;
a first substrate unit that is contained in the containing space, and outputs power input from a power source on the outside of the housing with respect to a load; and
a second substrate unit that is contained in the containing space, outputs power input from a power source on the outside of the housing with respect to a load, and is different from the first substrate unit, wherein
the first substrate unit includes a first power source input terminal that supplies power from the power source to the first substrate unit,
the second substrate unit includes a second power source input terminal, different from the first power source input terminal, that supplies power from the power source to the second substrate unit,
the first power source input terminal includes a first terminal exposed portion at least a part of which is exposed to the outside of the housing,
the second power source input terminal includes a second terminal exposed portion at least a part of which is exposed to the outside of the housing, and
the first terminal exposed portion, the second terminal exposed portion, and a power source connection terminal connected to the power source are fastened by a fastening member, such that the first terminal exposed portion and the second terminal exposed portion contact each other, and are electrically connected to each other.

2. The electric connection box according to claim 1, further comprising:
an inter-substrate power supply unit that supplies power output from the second substrate unit to the first substrate unit, wherein
the inter-substrate power supply unit includes
a first fitting portion that is electrically connected to the first substrate unit, and
a second fitting portion that is electrically connected to the second substrate unit, and fits into the first fitting portion in a contained state in which the first substrate unit and the second substrate unit are contained in the housing.

3. The electric connection box according to claim 2, wherein
the first substrate unit includes a first substrate and a plurality of first electronic components,
the second substrate unit includes a second substrate and a plurality of second electronic components,
the plurality of first electronic components are mounted on the first substrate,
the plurality of second electronic components are mounted on the second substrate, and
in the containing space, the plurality of first electronic components face the plurality of second electronic components between the first substrate and the second substrate.

4. The electric connection box according to claim 3, wherein
the containing space is divided into a first containing space and a second containing space, the first containing space contains the first substrate unit and the second containing space contains the second substrate unit.

5. The electric connection box according to claim 2, wherein
the first substrate unit is a power distributor that distributes and outputs power input from at least the power source, and
the second substrate unit is a voltage converter that converts an input direct current voltage value into a different direct current voltage value.

6. The electric connection box according to claim 1, wherein
the first substrate unit includes a first substrate and a plurality of first electronic components,
the second substrate unit includes a second substrate and a plurality of second electronic components,
the plurality of first electronic components are mounted on the first substrate,
the plurality of second electronic components are mounted on the second substrate, and
in the containing space, the plurality of first electronic components face the plurality of second electronic components between the first substrate and the second substrate.

7. The electric connection box according to claim 6, wherein
the first substrate unit is a power distributor that distributes and outputs power input from at least the power source, and
the second substrate unit is a voltage converter that converts an input direct current voltage value into a different direct current voltage value.

8. The electric connection box according to claim 1, wherein
the first substrate unit is a power distributor that distributes and outputs power input from at least the power source, and
the second substrate unit is a voltage converter that converts an input direct current voltage value into a different direct current voltage value.

9. The electric connection box according to claim 1, wherein
the containing space is divided into a first containing space and a second containing space, the first containing space contains the first substrate unit and the second containing space contains the second substrate unit.

* * * * *